(12) United States Patent
Andry et al.

(10) Patent No.: US 8,290,008 B2
(45) Date of Patent: Oct. 16, 2012

(54) SILICON CARRIER OPTOELECTRONIC PACKAGING

(75) Inventors: Paul S. Andry, Yorktown Heights, NY (US); Russell A. Budd, Yorktown Heights, NY (US); Bing Dang, Yorktown Heights, NY (US); David Danovitch, Bromont (CA); Benjamin V. Fasano, Yorktown Heights, NY (US); Paul Fortier, Bromont (CA); Luc Guerin, Bromont (CA); Frank R. Libsch, Yorktown Heights, NY (US); Sylvain Ouimet, Bromont (CA); Chirag S. Patel, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 86 days.

(21) Appl. No.: 12/544,696

(22) Filed: Aug. 20, 2009

(65) Prior Publication Data
US 2011/0044369 A1 Feb. 24, 2011

(51) Int. Cl.
*H01S 5/022* (2006.01)
*H01S 5/024* (2006.01)
(52) U.S. Cl. .... 372/36; 372/34; 372/50.12; 372/50.124; 372/50.23; 257/690
(58) Field of Classification Search .............. 372/34, 372/36, 50.12, 50.124, 50.23; 257/690
See application file for complete search history.

(56) References Cited

U.S. PATENT DOCUMENTS

| | | | | |
|---|---|---|---|---|
| 5,243,140 A | * | 9/1993 | Bhatia et al. | 174/254 |
| 6,558,976 B2 | * | 5/2003 | Shrauger | 438/106 |
| 7,058,247 B2 | * | 6/2006 | Crow et al. | 385/14 |
| 7,486,847 B1 | * | 2/2009 | Dellmann et al. | 385/14 |
| 2002/0142513 A1 | * | 10/2002 | Fee et al. | 438/106 |
| 2004/0091005 A1 | * | 5/2004 | Hofmeister et al. | 372/34 |
| 2008/0029886 A1 | * | 2/2008 | Cotte et al. | 257/728 |

OTHER PUBLICATIONS

Budd, "3D optoelectronic package," U.S. Appl. No. 12/544,710, amended claims filed Jul. 19, 2011.*

* cited by examiner

*Primary Examiner* — Patrick Stafford
*Assistant Examiner* — Michael Carter
(74) *Attorney, Agent, or Firm* — Scully, Scott, Murphy & Presser, P.C.; Daniel P. Morris, Esq.

(57) ABSTRACT

An optoelectronic (OE) package or system and method for fabrication is disclosed which includes a silicon layer with wiring. The silicon layer has an optical via for allowing light to pass therethrough. An optical coupling layer is bonded to the silicon layer, and the optical coupling layer includes a plurality of microlenses for focusing and or collimating the light through the optical via. A plurality of OE elements are coupled to the silicon layer and electrically communicating with the wiring. At least one of the OE elements positioned in optical alignment with the optical via for receiving the light. A carrier is interposed between electrical interconnect elements. The carrier is positioned between the wiring of the silicon layer and a circuit board and the carrier is electrically connecting first interconnect elements connected to the wiring of the silicon layer and second interconnect elements connected to the circuit board.

12 Claims, 13 Drawing Sheets

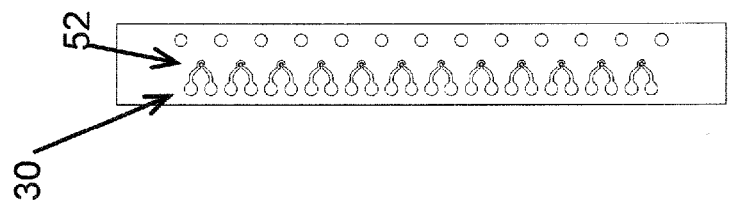
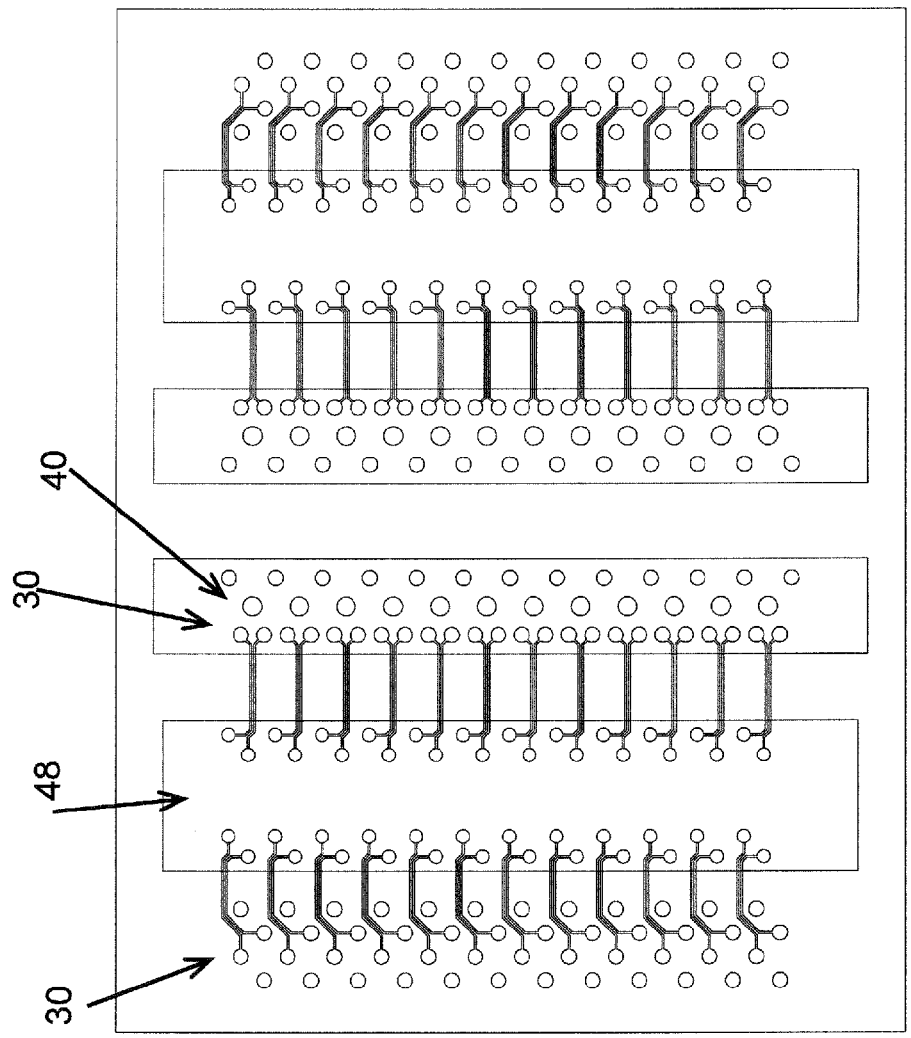
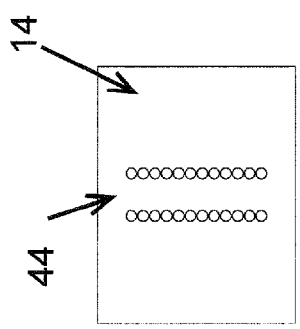

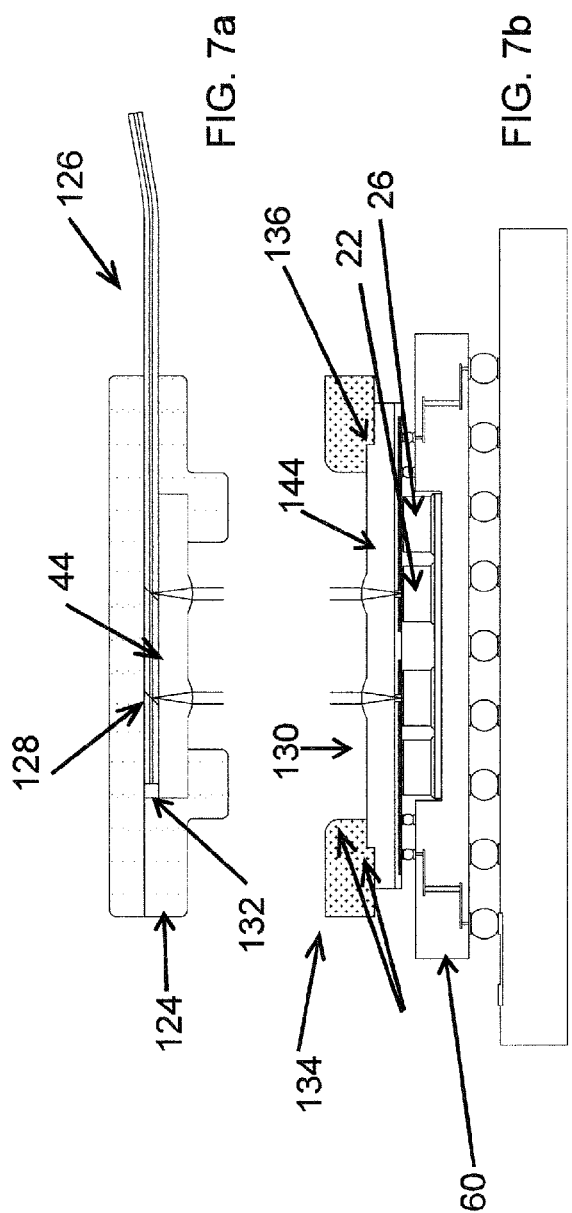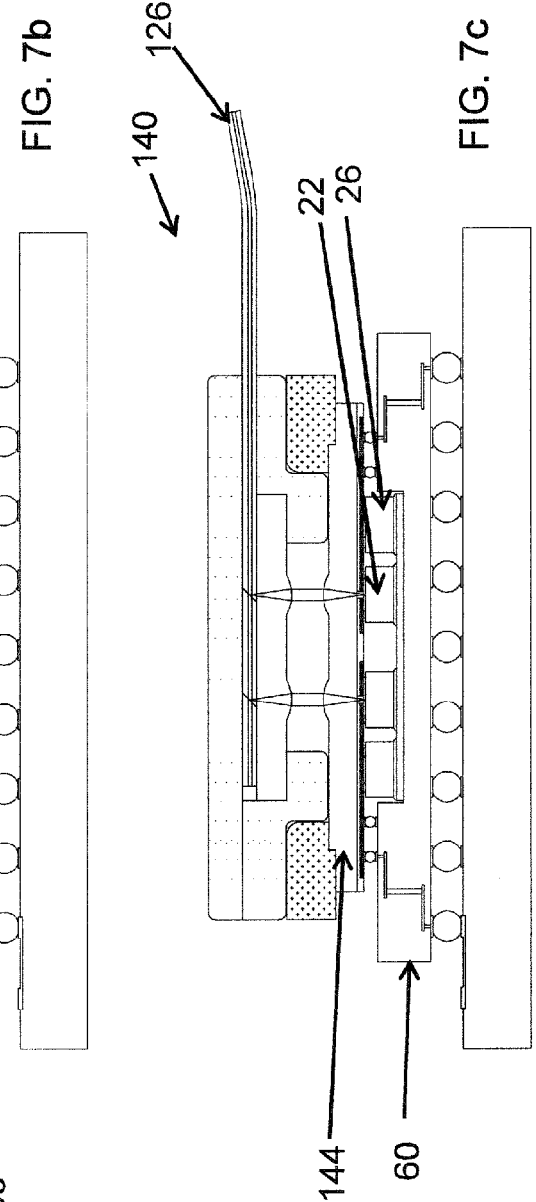

SILICON CARRIER OPTOELECTRONIC PACKAGING

CROSS REFERENCE TO RELATED APPLICATION

This application is related to the following commonly-owned, co-pending United States patent application filed on even date herewith, the entire contents and disclosure of which is expressly incorporated by reference herein in its entirety: U.S. patent application Ser. No. (24252), for "3D OPTOELECTRONIC PACKAGING".

BACKGROUND

The present invention relates generally to the field of integrated circuits and silicon chip technology, and more particularly, relates to a packaging system or packaging assembly and method thereof for optoelectronic devices in integrated circuits and silicon chip technology.

Computer system performance is increasingly important in current computer systems and data centers, including for example, personal computers, servers and server farms. Computer performance is measured by, for example, system availability, speed of computation, processor speed, among other measurable aspects. The communication bandwidth between computers and within a computer is important in a computer system's overall performance. The current trend towards multi-core processors and multiple processors per machine requires an increase in communication between processors, and between a processor and its memory. Current use of electrical data links perform best over short distances, but they reach a performance limit as the link distance and frequency increases. Optical data links over fiber are capable of high speed communication with low loss over large distances, however, current optical transceivers are bulky and expensive compared with their electrical counterparts.

Therefore, there is a need for a system or assembly/package and a method for reducing the size of optical transceivers used in computers, integrated circuits and chips. It would also be desirable for a system or assembly/package and method to lower the cost of using optical transceivers in computers, integrated circuits and chips.

BRIEF SUMMARY

In an aspect of the present invention, an optoelectronic (OE) assembly for a semiconductor or computer chip includes a silicon layer with wiring, the silicon layer defines at least one optical via for allowing light to pass therethrough. An optical coupling layer is bonded to the silicon layer. The optical coupling layer includes a plurality of microlenses for focusing and or collimating the light through the optical via. A plurality of OE elements are coupled to the silicon layer and electrically communicating with the wiring. At least one of the OE elements is positioned in optical alignment with the optical via for receiving the light. In a related aspect, the plurality of OE elements are attached beneath the silicon layer and electrically communicating with the wiring, and the OE elements are positioned in optical alignment with the optical via for receiving the light. The assembly may further include VCSELs (vertical cavity surface emitting lasers) and photodiodes as OE elements, and interconnect elements for attaching the assembly to an additional level of packaging. The interconnect elements may include C4s, and compressions bond pads. Further, at least one of the OE elements may be a laser diode driver and transimpedance (LDD/TIA) element, the LDD/TIA element includes circuitry, and the wiring is positioned between the LDD/TIA element and the microlenses for electrically connecting the LDD/TIA element to interconnect elements. In another related aspect, the assembly may further include a carrier for interposing between electrical interconnect elements. The carrier is positioned between the wiring of the silicon layer and a circuit board, and the carrier electrically connects first interconnect elements connected to the wiring of the silicon layer and second interconnect elements connected to the circuit board. Additionally, in a related aspect, the carrier may include a recessed portion for housing the OE elements. The carrier may be positioned between the wiring of the silicon layer and a circuit board and electrically connecting first interconnect elements connected to the wiring of the silicon layer and second interconnect elements connected to the circuit board. In another related aspect, a carrier and thermal sink interposer may be positioned over the OE elements and in thermal contact with the OE elements. In a further related aspect, a carrier and thermal sink interposer may be positioned over the OE elements and in thermal contact with the OE elements, and the carrier may include an alignment feature for positioning the carrier in mating relation with the optical coupling layer. In another related aspect, at least one semiconductor element may be attached to a carrier, and the carrier is electrically connected to the wiring of the silicon layer and a circuit board. In another related aspect, the semiconductor element is selected from a group comprising: a processor and an application specific integrated circuit (ASIC) chip. In a relate aspect, the assembly of claim 1 further includes at least one additional silicon layer including active devices connected to the wiring of the silicon layer and a carrier, the carrier electrically connected to the wiring of the silicon layer and a circuit board.

In another aspect of the invention, an optoelectronic (OE) package or system for semiconductor fabrication includes a silicon layer with wiring. The silicon layer defines at least one optical via for allowing light to pass therethrough. An optical coupling layer is bonded to the silicon layer, and the optical coupling layer includes a plurality of microlenses for focusing and or collimating the light through the optical via. A plurality of OE elements are coupled to the silicon layer and electrically communicating with the wiring. At least one of the OE elements is positioned in optical alignment with the optical via for receiving the light. A carrier interposes between electrical interconnect elements. The carrier is positioned between the wiring of the silicon layer and a circuit board, and the carrier is electrically connecting first interconnect elements connected to the wiring of the silicon layer and second interconnect elements connected to the circuit board. In a related aspect, at least one of the OE elements is a laser diode driver and transimpedance (LDD/TIA) element. The LDD/TIA element includes circuitry, and the wiring is positioned between the LDD/TIA element and the microlenses for electrically connecting the LDD/TIA element to interconnect elements. In a related aspect, the carrier includes a recessed portion for housing the OE elements. The assembly may also include a thermal sink interposer positioned over the OE elements and in thermal contact with the OE elements. In a related aspect, the assembly may further include a thermal sink interposer positioned over the OE elements and in thermal contact with the OE elements. The carrier includes an alignment feature for positioning the carrier in mating relation with the optical coupling layer. The assembly may further comprise at least one additional silicon layer including active devices connected to the wiring of the silicon layer and the carrier.

In another aspect of the invention, a method for assembling or packaging a semiconductor or chip includes: fabricating a silicon layer with wiring, the silicon layer defining at least one optical via for allowing light to pass therethrough; bonding an optical coupling layer to the silicon layer, the optical coupling layer including a plurality of microlenses for focusing and or collimating the light through the optical via; coupling a plurality of OE elements to the silicon layer and the OE elements electrically communicating with the wiring; positioning at least one of the OE elements in optical alignment with the optical via for receiving the light; and interposing a carrier between electrical interconnect elements, and positioning the carrier between the wiring of the silicon layer and a circuit board and electrically connecting first interconnect elements to the wiring of the silicon layer and second interconnect elements to the circuit board. The method may further include positioning a thermal sink interposer over the OE elements and in thermal contact with the OE elements. In a related aspect, the method may further include connecting at least one additional silicon layer including active devices connected to the wiring of the silicon layer and the carrier.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 2a is a plan view of the integrated OE assembly shown in FIG. 1;

FIG. 2b is a bottom view of the OE assembly shown in FIG. 1 showing an outline of LDD/TIA chip positions;

FIG. 2c is a shows detail view of the wiring between an OE source region and the OE's interconnect pads;

FIGS. 7a, 7b, and 7c are side elevational views of embodiments of OE assemblies attached to a carrier and a mating optical connector;

DETAILED DESCRIPTION

Figure 1:
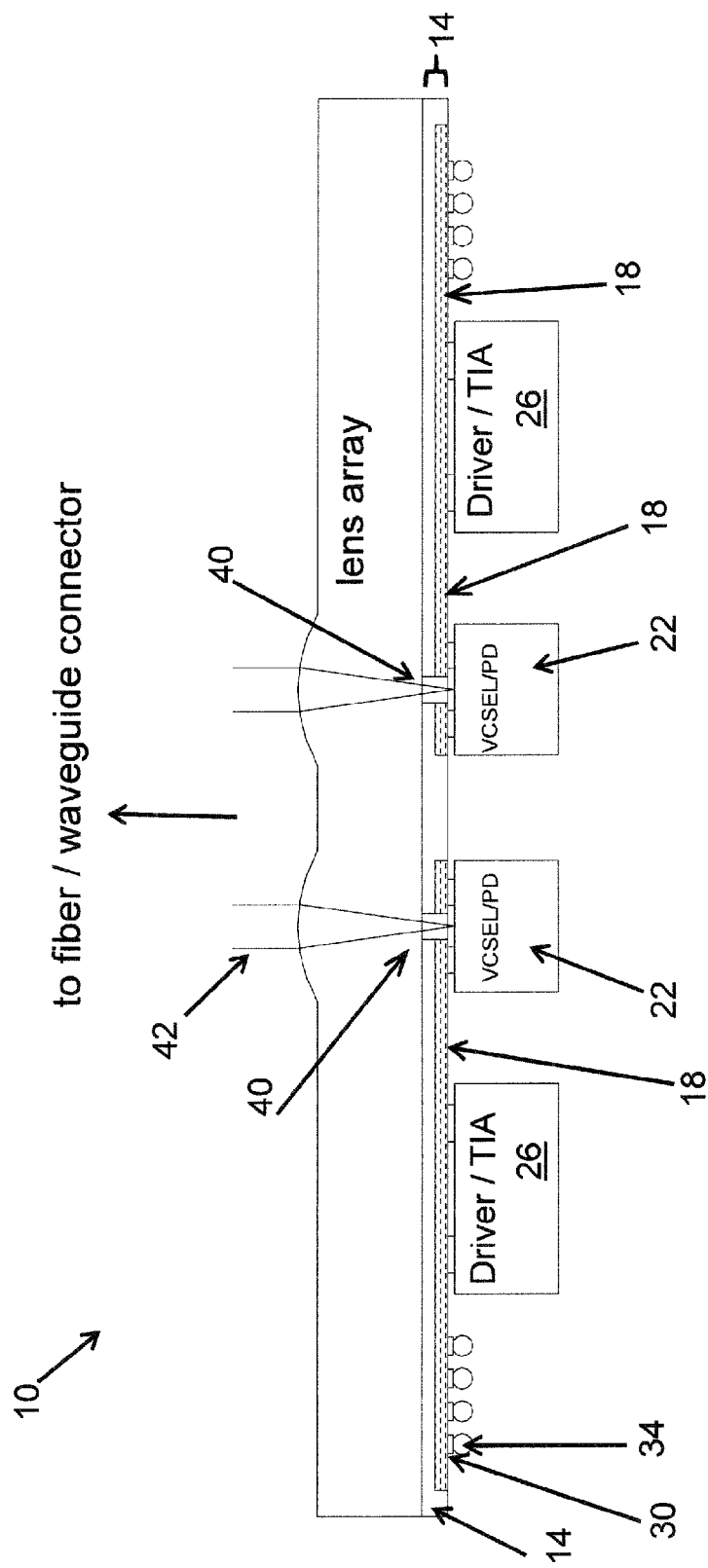
FIG. 1 is a side elevational cross-sectional view of an integrated optoelectric (OE) assembly, including a silicon carrier, OE LDD drivers/TIAs, OE arrays, and optical coupling elements.

In an illustrative embodiment of the present invention, referring to FIG. 1, an integrated optoelectric (OE) package or assembly 10 is depicted and may be fabricated using standard complementary metal-oxide-semiconductor (CMOS) processes. The OE assembly 10 includes a silicon substrate 14 that contains wiring layers 18 of fine wiring and, in an alternative embodiment, electrical circuitry. The fine wiring 18 interconnects OE arrays 22 which in the embodiment of FIG. 1 is an array of vertical cavity surface emitting lasers (VCSEL) or photo diode (PD) arrays, herein collectively referred to as the OE arrays 22. The OE arrays 22 communicate with laser diode drivers (LDD) and transimpedance amplifiers (TIAs) collectively referred to with reference numeral 26. Dedicated wiring of the fine wiring 18 route signals from the LDDs and TIAs 26 to pads 30 have C4 bumps 34 or other interconnect elements.

A through hole 40 (or optical via) is fabricated in the substrate. The hole 40 enables light 42 to pass from the OE device to a microlens array 44 on the substrate 14. The through hole 40 is, for example, 50 to 200 microns in diameter, however smaller or larger hole sizes are possible and may be fabricated using an etch process such as, Bosch™® etch. As an alternative to individual holes (one hole/OE source or detector region), a through slot which spans all OE source/detector regions of a particular OE array may be fabricated. The microlens array 44 functions to collimate or focus the light to and from the OE arrays 22. The glass microlens array 44 wafer may have a thickness of 100 to 1000 microns In the embodiment of the present invention depicted in FIG. 1, a method for manufacturing the integrated optoelectric (OE) package or assembly 10 includes the steps below (which are not shown in the drawings). After silicon wiring layers (resulting in wiring layers 18 in the substrate 14) have been fabricated on a silicon wafer, a through hole (or optical via) is fabricated (shown as hole 40 on the substrate 14). The hole 40 enables light to pass from the OE device to a microlens array (shown as lens array 44 on the substrate 14). The through hole 40 is for example, 50 to 200 microns in diameter however smaller and larger sizes are possible and may be fabricated using an etch process such as, Bosch™® etch. The silicon wafer is then attached to a temporary handling wafer, and is ground and polished to a thickness of between about 10 to 200 microns. After polishing, the silicon wafer may be further thinned by chemical etch (for example, using Si anisotropic etching, for example, TMAH (tetramethylammonium hydroxide) or KOH (potassium hydroxide) etching), leaving the Si wiring and Si circuitry on the glass handler. When the Si wiring is left on the glass, the high speed electrical performance of the wiring is improved. Also, by leaving the Si wiring and circuitry on the glass handler, there is no need to fabricate the optical via or optical window since all bulk Si (other than the wiring and circuitry) is removed. The silicon wafer is then transferred and attached to a glass wafer which contains microlenses. The glass wafer could contain microlenses of spherical or aspherical shapes. The microlenses could be refractive or diffractive or a combination. Instead of glass other optically transparent materials could be used such as InP or GaAs (indium phosphorus or gallium arsenide), or transparent plastic. A microlens array functions to collimate or focus the light to and from OE elements (OE arrays 22). The temporary handling wafer is then removed exposing the silicon wiring and pads. The wafer may then be bumped by attaching C4 balls (shown as solder balls 34 on the substrate 14), or other interconnect elements (for example, pins, or columns) may be attached, resulting in the silicon substrate 14. The next step in the fabrication process is to attach OE devices to the substrate 14. A VCSEL array (vertical cavity surface emitting laser diode array) or a PD array (photodiode array) is bonded to the silicon substrate using standard flip chip bonding tools (such as SUSS® Microtech flip chip bonder). The OE to silicon chip join may consist of micro C4s solder balls, compression bonds, or other interconnects. The LDD, TIA, and the OE may be underfilled to protect and secure the chip joins to complete the fabrication of the OE assembly 10. Other processing/manufacturing sequences of the above individual steps may be used to generate the OE assembly 10 which are within the scope and spirit of the present invention.

The silicon wafer may be fabricated using standard CMOS processes. Alternatively other device substrates could be used such as SiGe, GaAs, or silicon on insulator (SOI). The bonding of the glass lens wafer to the silicon is performed using standard wafer to wafer bonding tools. An alignment accuracy of +/−1 micron is obtained.

Referring to FIG. 2a, the OE assembly 10 includes a 2×12 array of microlenses. It is understood that other lens arrangements are possible, such as a 1×12 array, a 4×12 array or larger two dimensional arrays of lenses.

FIG. 2b shows a bottom view of the OE assembly 10 with the LDD/TIA elements 26 removed. The interconnect pads 30 are bumped with C4 balls 34 as shown in FIG. 1. The interconnect pads 30 provide the connection between the OE assembly 10 and a next level of packaging. High density wiring 18 connects the pads to the LDDs and TIAs chips 48. The LDD and TIAs chips 48 are connected to pads 30 on which the OE device 10 is mounted. The through hole optical via 40 allows light to pass to the microlenses 44. Alternatively, it may be desirable, in view of high frequency electrical signal integrity, to control the electrical impedance and balance the timing skew between different channels between the pads 30 of the circuitry on the LDD or TIA chip 48 (input/interconnect pads), and the pads 30 connecting the OE 10 to another device (OE ouput pads). One way to control the electrical impedance and balance the trimming skew is by minimizing the electrical signal lines length difference between the channels in a layout circuit wiring. Another optimization includes minimizing the area of the LDD and TIA circuitry layout on the chip 48, which may involve placing the individual LDD/TIA channel circuitry on the same pitch as the OE pads 30 or OE diodes.

Referring to FIG. 2c, a VCSEL array 22 is shown having the OE 10 with a source region 52 which emits light. The pads 30 interconnect the source region 52 to silicon drive circuitry. The arrangement of pads may be similar for the photodiode (PD) arrays 22. It is understood that the OE lens array 44 (and OE devices) may be multidimensional, for example a 2×12, 4×12 or a larger array of active elements.

Figure 3:
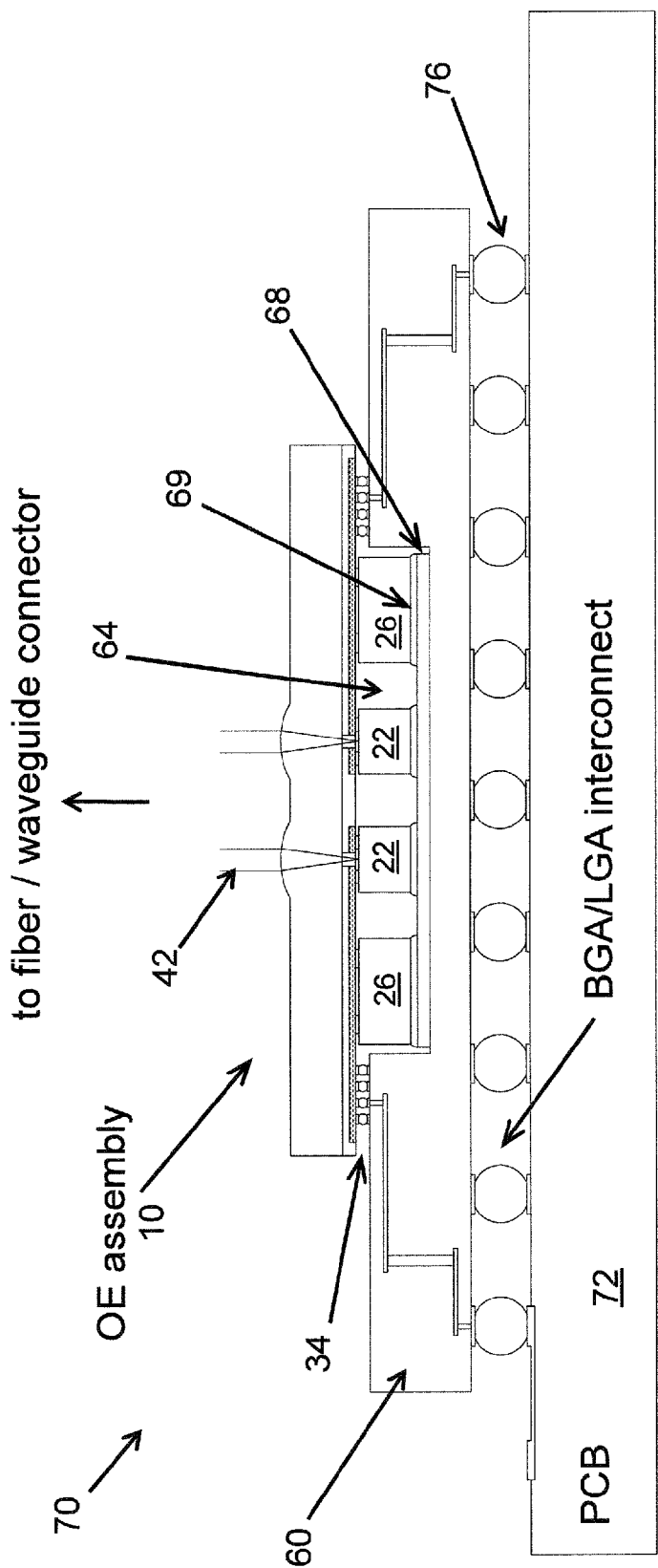
FIG. 3 is a side elevational view of the OE assembly shown in FIG. 1 attached to a chip carrier and the chip carrier attached to a printed circuit board using a BGA or LGA interconnect.

Referring to FIG. 3, in another embodiment of the invention, a package 70 includes the OE assembly 10 mounted on a carrier 60. The carrier 60 may be, for example, an organic laminate, ceramic, Silicon, or other substrate material. The device drivers, i.e., the LDD drivers/TIA and OE arrays 22, on the OE assembly 10 protrude into a cavity 64 on the carrier 60. C4 balls 34 interconnect the OE assembly 10 to the carrier 60. The C4 interconnects 34 may be underfilled to strengthen and protect the integrity of the join. A heat spreader 68 is positioned at the bottom of the cavity 64. The heat spreader 68 may be used to transfer heat from the OE 10 and for example, CMOS devices, to the side of the package 70 for removal by, for example, an air cooled heat sink, a water cooled heat sink, or by other standard heat removal means. The carrier 60 may be further attached to a printed circuit board (PCB) 72 by means of a ball grid array (BGA) or land grid array (LGA) interconnect 76. The carrier 60 also serves as an electrical and mechanical interposer. The OE assembly 10 is used to form a custom number of optical channels, with the carrier 60 serving as an electrical and mechanical interposer between the OE assembly 10 and the PCB 72.

Figure 4:
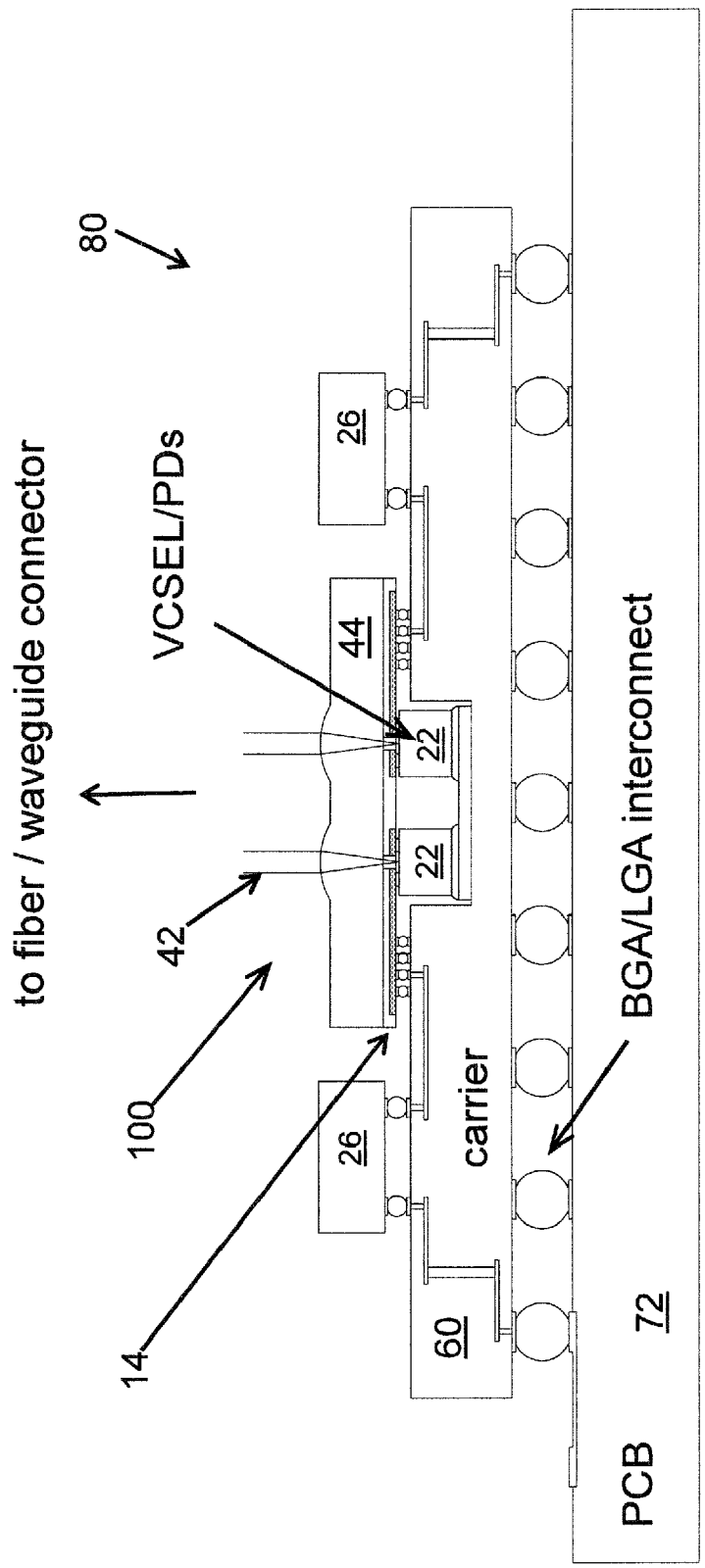
FIG. 4 is a side elevational view of another embodiment of an integrated OE assembly attached to a carrier, driver/TIA circuits are shown attached on the top of the carrier adjacent to the OE assembly.

Referring to FIG. 4, another embodiment of the invention includes a package 80 including an embodiment of an OE assembly 100 wherein features consistent with the OE assembly 10 shown in FIG. 1 have the same reference numerals. The OE assembly 100 includes the silicon substrate 14, OE arrays 22, and an attached lens array 44. In this case the LDD and TIA devices 26 are attached to the carrier 60. It is understood the carrier may be organic, ceramic, silicon, or other suitable material. It is understood that a number of OE arrays 22 may be extended beyond two arrays. It is also understood that a combination VCSEL and photodiode arrays 22 may be used on the OE assembly 100 to provide a transceiver function.

Figure 5:
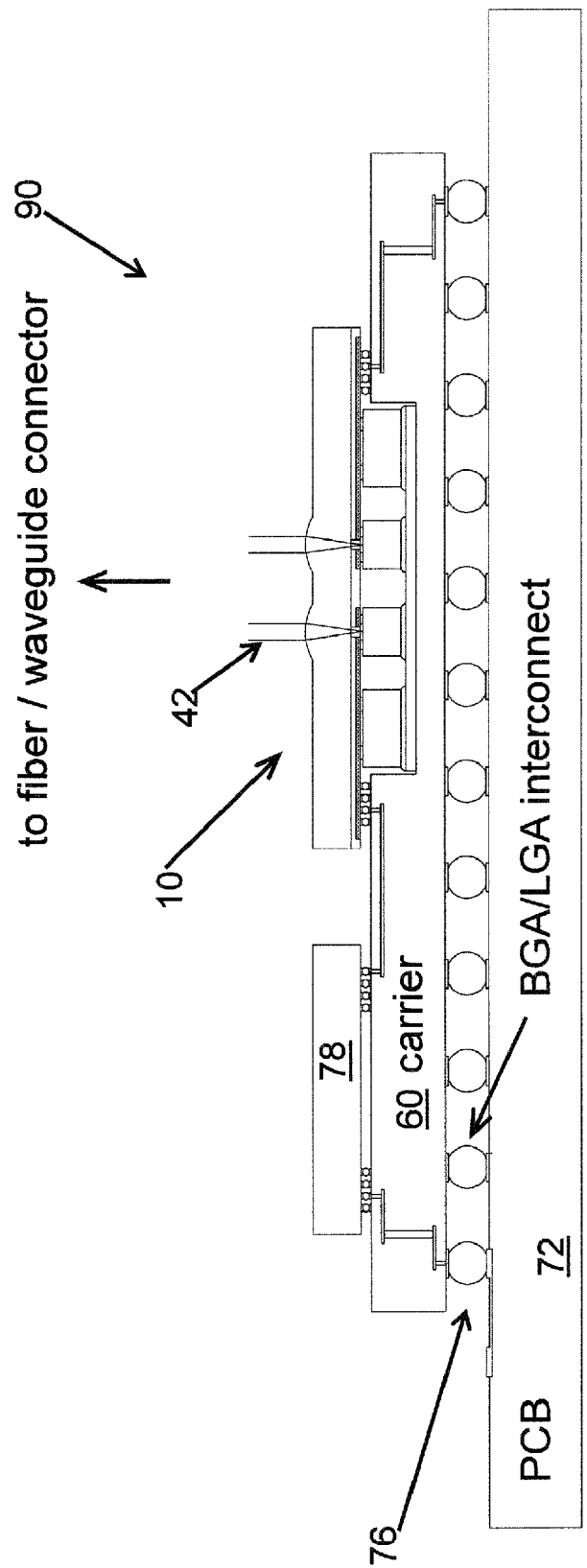
FIG. 5 is a side elevational view of another embodiment of an integrated OE assembly attached to a carrier substrate, a processor or ASIC chip is adjacent to the OE assembly.

Referring to FIG. 5, in another embodiment of the invention, a package 90 includes the OE assembly 10 (shown in FIGS. 1 and 3) and an additional device attached to the carrier substrate 60. The additional device may be a processor or ASIC (application specific integrated circuit) chip 78, or another component. In some cases, it is highly desirable to place the additional device 78 as close as possible to the OE assembly 10 to minimize the electrical power and cost by incorporating some or all of the LDD circuitry 26 within the additional device 78. In alternative cases, it may be desirable to use standard (non-custom) additional device(s) where the needed LDD/TIA 26 circuitry requirements are in the OE assembly 10.

Figure 6:
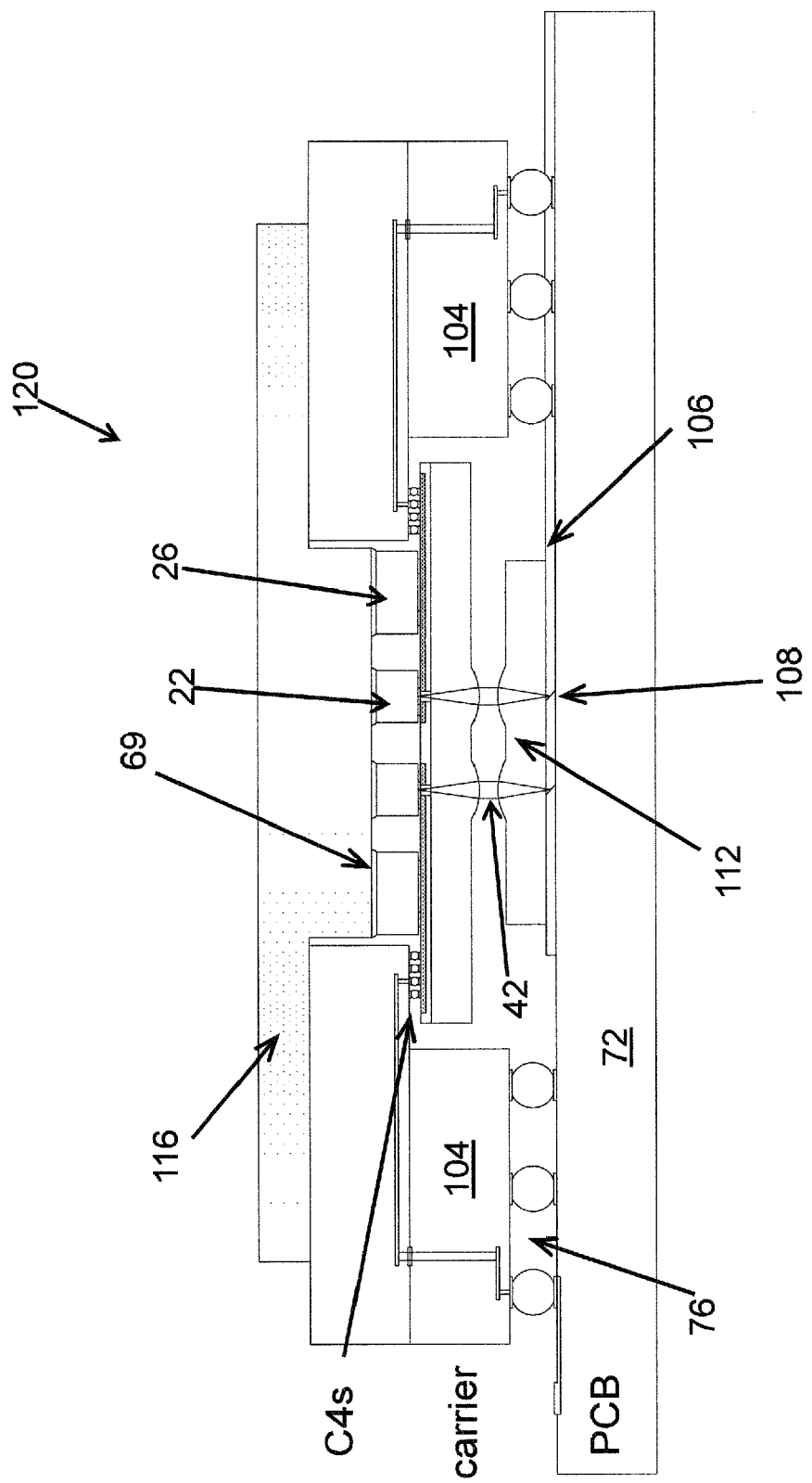
FIG. 6 is a side elevational view of another embodiment of an OE assembly attached to a carrier substrate, the light is orientated downward and the OE devices and the divers/TIAs are cooled from the top.

Referring to FIG. 6, another embodiment of a package 120 includes the OE assembly 10 rotated one hundred and eighty degrees and attached to a carrier substrate 104. In the embodiment of FIG. 6, the carrier substrate includes an optional recessed region, including an electrical interconnection in the recessed region to connect the OE assembly to the carrier 104. Alternatively (not shown), the carrier could have only a hole or rectangular opening and no recessed region, in this case, electrical interconnect is done on the bottom side of the carrier. Also, an additional interposer (not shown) could be used to create a larger gap between the PCB and the OE assembly.

The light 42 is orientated downward towards the printed circuit board (PCB) 72. Optical waveguides 106 are attached to the top surface of the PCB 72. A lens array 112 is positioned on top of the waveguides 106 which couples the light from the OE assembly 10 to the waveguide cores. Also, waveguide turning mirrors 108 reflect the light 42 ninety degrees. The light 42 within the optical waveguides 106 may be conveyed across the PCB 72 to other optical assemblies or to an edge of the printed circuit board for interconnection with an optical backplane or optical fiber cables. A heat spreader 116 in positioned on the top of the carrier 104. The thermal interface material 69 is used to connect the heat spreader 116 to the LDDs/TIAs 22, and OE arrays 22. The heat spreader 116 may be connected to a top side heat sink to remove heat from the package 120.

Referring to FIGS. 7a, 7b, and 7c, the OE assembly 10 is attached to the carrier 60 and a mating waveguide/optical connector 124. Referring to FIG. 7a, an optical cable 126 is connected to the waveguide/optical connector 124. The waveguide cable 126 may be a polymer and incorporates turning mirror elements 128, a lens array 44, and a connector housing 132.

Referring to FIG. 7b, an OE assembly 130 on the carrier 60 incorporates an alignment frame 134. The alignment frame 134 is passively aligned to the lens OE assembly 130 lens array 144, and then glued into place. During fabrication of the lens array 144, additional features may be formed which can be used to accurately position the alignment frame 134. For example, a step 136 is formed in the lens array 144, for the alignment frame 134 to reference. Thereby, after assembly the alignment frame 134 is accurately referenced to the lens array 144 and the devices 26 to specified semiconductor tool tolerances, such as, within a 1 or 2 micron alignment tolerance. The OE assembly 130 is mated to the optical connector 124 as shown in FIG. 7c forming a package 140. The optical connector 124 seals the optical elements, i.e., the turning mirrors 128, the waveguide cable 126 and connector 132 from dust or other contaminates.

Figure 8:
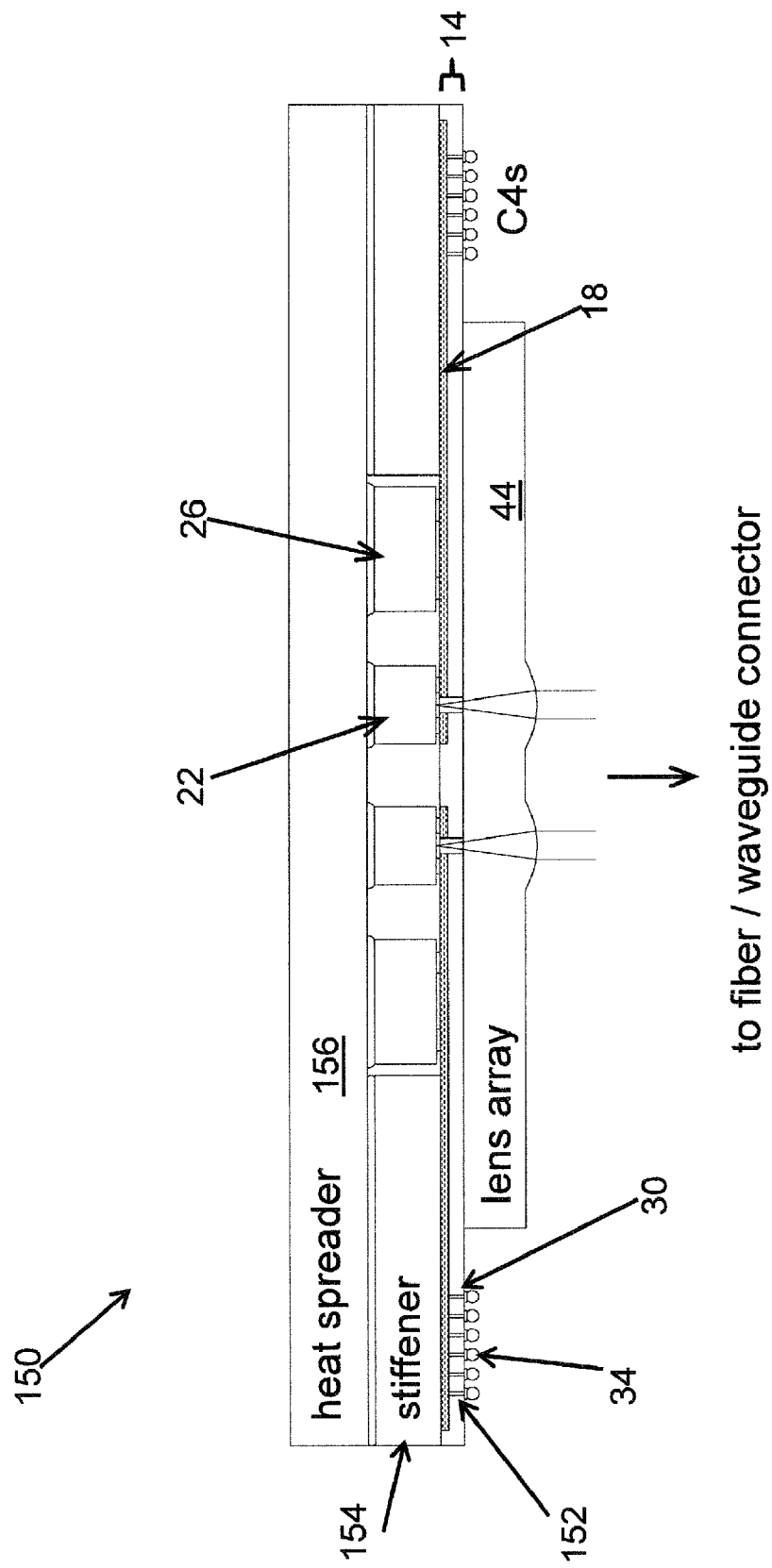
FIG. 8 is a side elevational view of another embodiment of an OE assembly, the silicon carrier contains through silicon vias.

Referring to FIG. 8, an alternate OE assembly 150 according to the invention includes wiring or circuitry 18 on top of the silicon substrate 14 interconnecting the VCSEL/PDs 22, and LDD/TIA 26 devices. The lens array 44 is aligned and attached to the silicon substrate or carrier 14. The silicon substrate/carrier 14 contains through silicon vias 152 which connect the top side wiring 14 to bottom side pads 30. C4 bumps 34 are attached to the pads 30. A stiffener frame 154 and a heat spreader 156 are positioned on top of one another. The head spreader 156 conducts heat from the LDD/TIA 26, and PDs 22 and spreads it laterally. A conventional heat sink may be attached to the top to cool the assembly 150.

Figure 9:
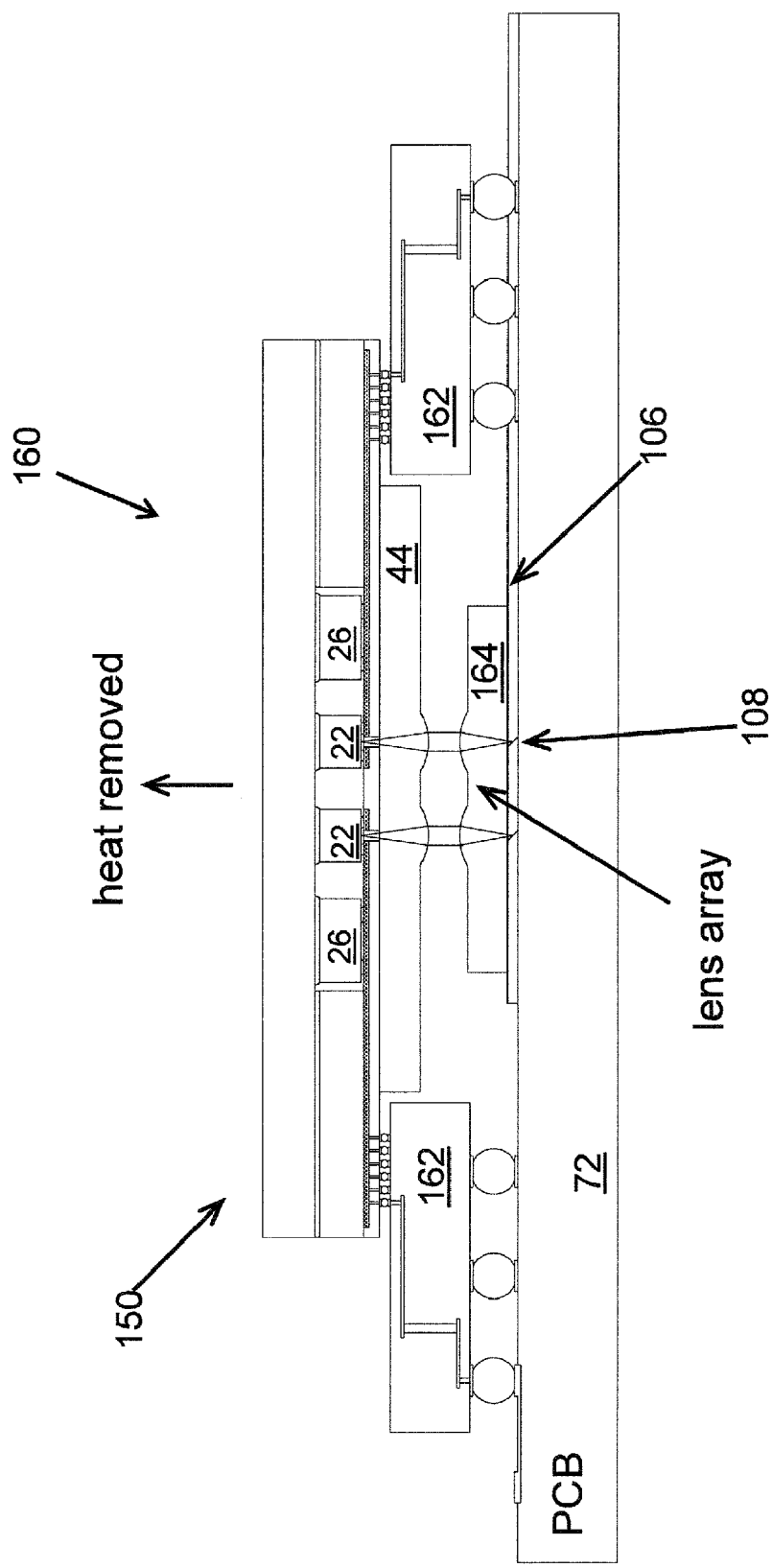
FIG. 9 is a side elevational view of an alternative embodiment of an OE assembly with through silicon vias attached to a carrier substrate.

Referring to FIG. 9, where like features have the same reference numerals as the embodiments of the invention shown in FIGS. 1, 3-8, another embodiment of an OE package 160 includes through silicon vias 152 in the embodiment of the OE assembly 150 shown in FIG. 8. The OE assembly 150 is attached to a carrier substrate 162. In the OE package 160, shown in FIG. 9, the light 42 is directed downward towards the PCB 72.

Figure 10:
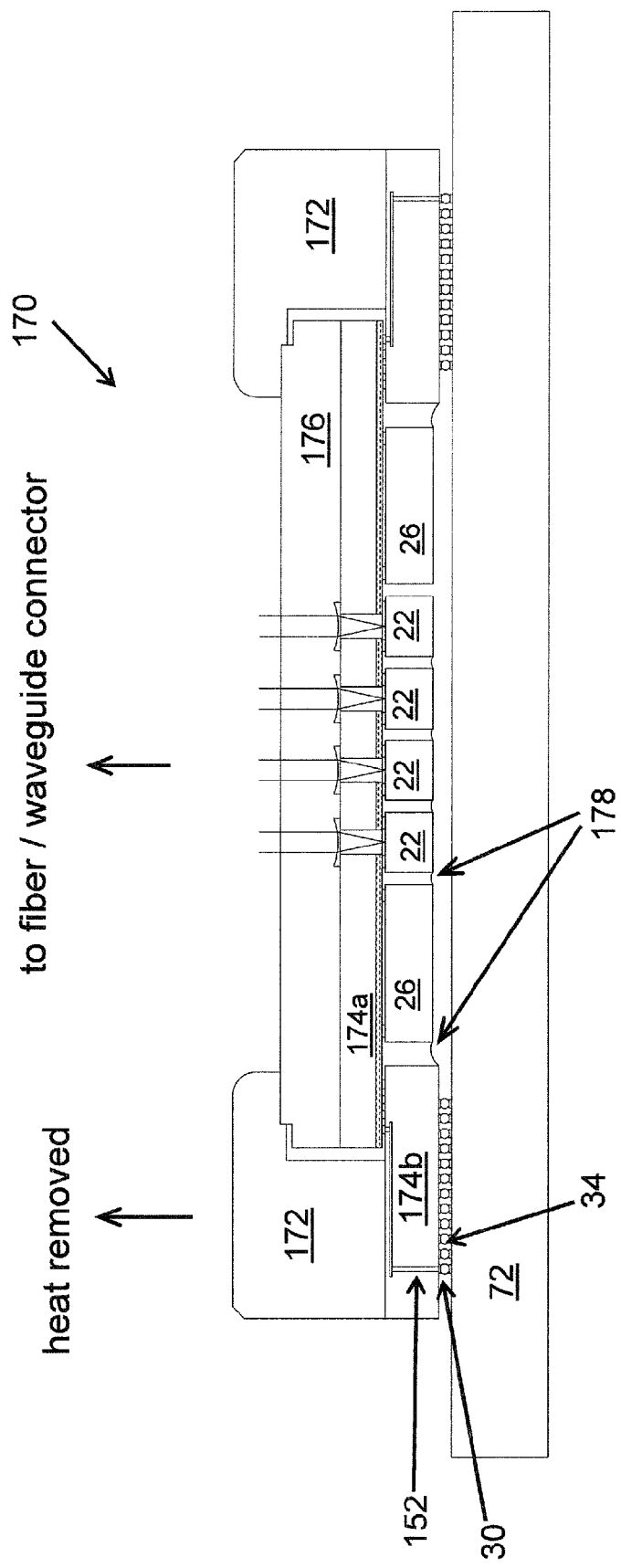
FIG. 10 is a side elevational view of an alternative embodiment of an integrated OE assembly including a silicon carrier, OE drivers/TIAs, OE devices, optical coupling elements, a silicon spacer frame with through vias, and a heat spreader/alignment frame.

Referring to FIG. 10, where like features have the same reference numerals as the embodiments of the invention shown in FIGS. 1, 3-9, another embodiment of an OE package 170 includes the LDDs/TIAs 26, and OE arrays 22a are attached to a first silicon substrate/carrier 174a which is thicker (e.g., between 100 to 800 microns thick) than in the previous embodiments shown in FIGS. 3-6. An optical coupling glass wafer is reversed and the microlens 176 surface faces the OE arrays 22. The glass lens array 176 may be thicker than in previous embodiments, since the light 42 passes through the glass substrate 176 in a collimated manner. A second silicon substrate 174b includes wiring 18 and through silicon vias 152 as shown in FIGS. 8 and 9. The second silicon substrate 174b is used to redistribute the signals from fine interconnect pads on the first silicon substrate 174a to larger pads 30 (and larger pitch) on the second silicon substrate 174b. Further, the second silicon substrate 174b conducts heat from the first silicon substrate 174a laterally to a heat spreader/alignment frame 172. The heat spreader/alignment frame 172 is bonded to the second silicon substrate 174b. A heat sink may be attached to the heat spreader/alignment frame 172 to cool the OE assembly 180. The heat spreader/alignment frame 172 may also serve as an alignment frame for mating with an optical connector. The components on the OE assembly 180 may be underfilled or sealed 178 as shown in FIG. 10. The sealing 178 serves to strengthen the components and protect the internal bond pads from the environment.

Figure 11:
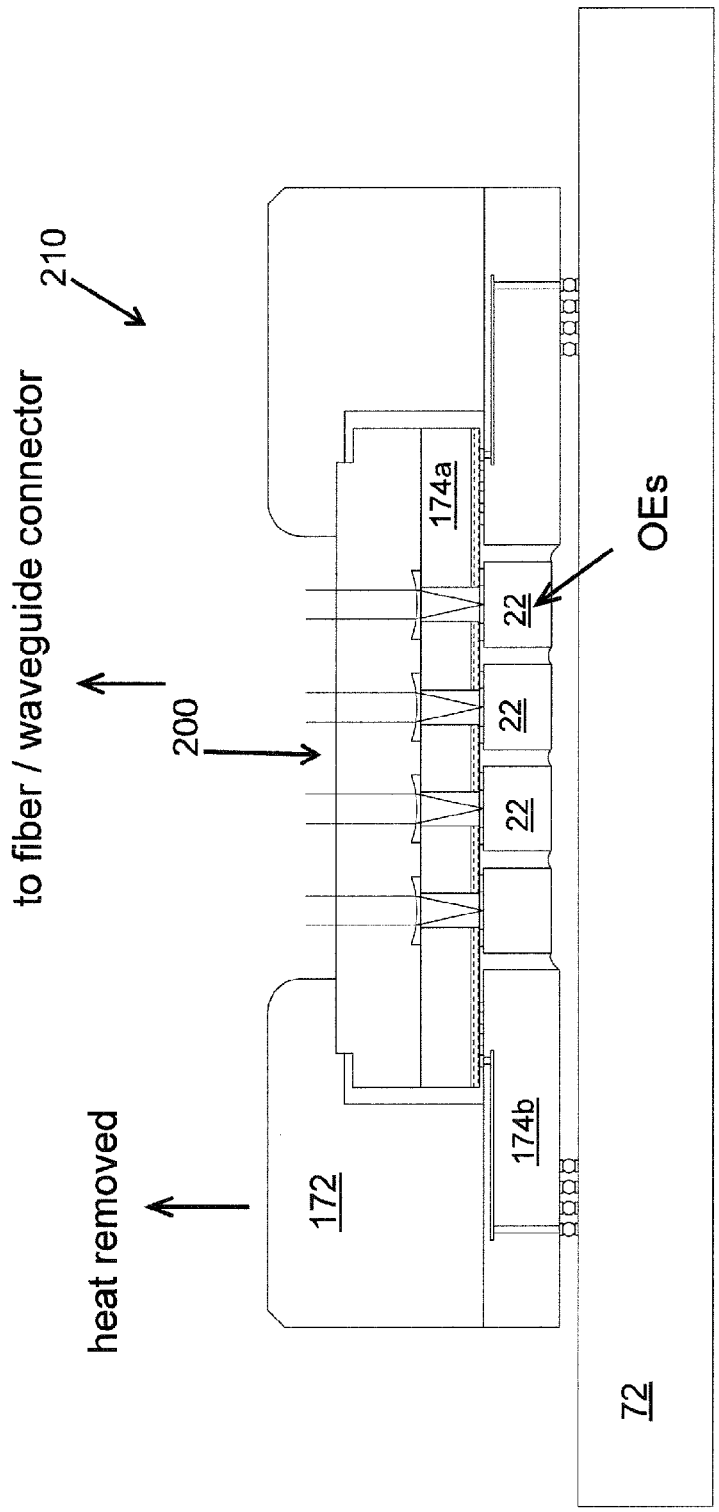
FIG. 11 is a side elevational view of another embodiment of an integrated OE assembly where the drivers and TIAs have been incorporated into the central silicon substrate.

Referring to FIG. 11, another embodiment of an OE assembly 200 in an OE package 210 is similar to the embodiment shown in FIG. 10, however, the OE assembly 200 includes LDD and TIA circuitry imbedded in the first silicon substrate 174a. In some cases, it is desirable to place the LDD and TIA devices as close as possible to the OE devices 22 to minimize the electrical power and cost by incorporating the circuitry in the first silicon substrate 174a. In an alternative embodiment, the LDD/TIA circuitry is attached to the first silicon substrate. Other embodiments may also include OE devices being two dimensional, e.g., containing 2×12 arrays, 4×12 arrays or more devices per OE substrate.

Figure 12:
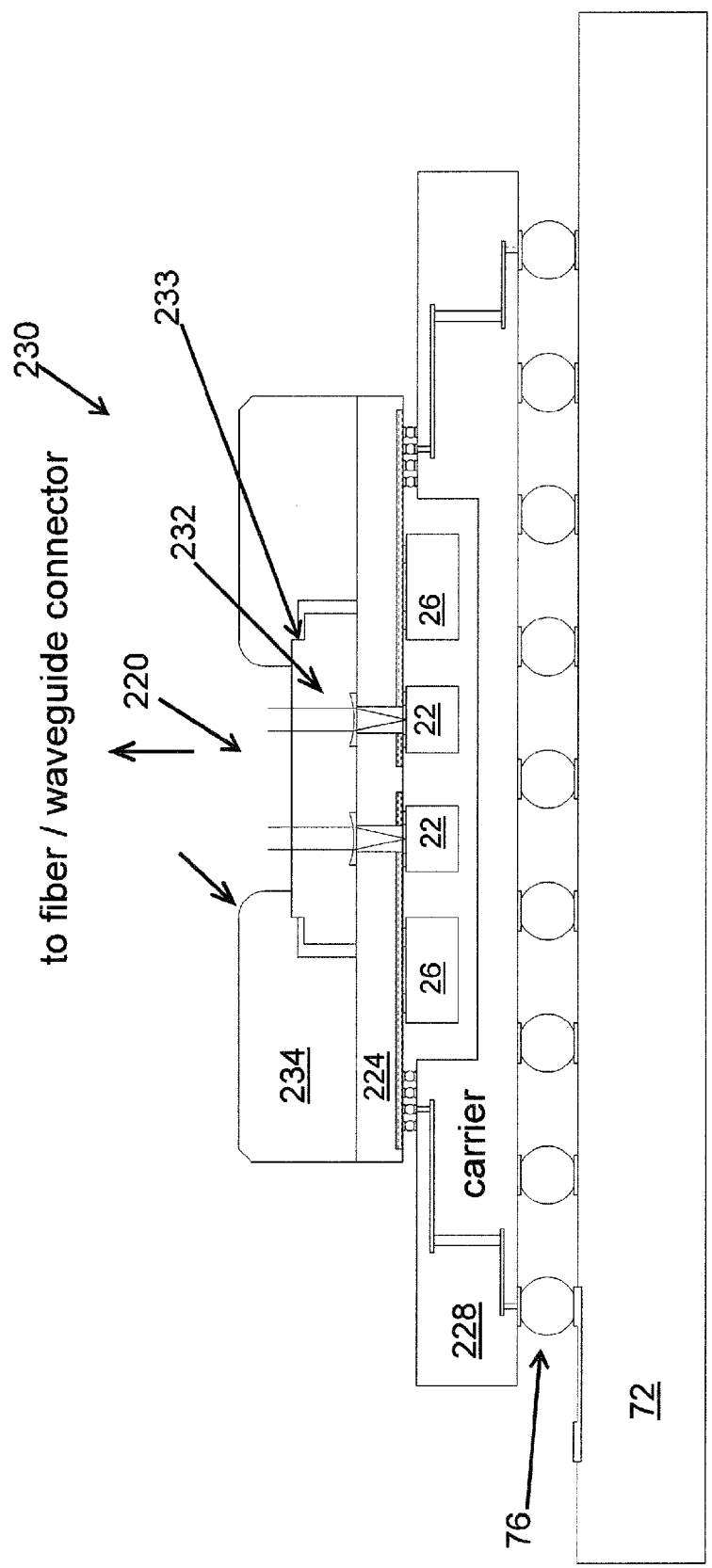
FIG. 12 is a side elevational view of another embodiment of an integrated OE assembly with heat spreader and alignment frame attached to a carrier substrate.

FIG. 12 shows an OE assembly 220 of an OE package 230 with a thicker silicon substrate 224. A lens array 232 is shortened in comparison to previous embodiments, thereby exposing a top portion of the silicon substrate 224. The exposed top portion of the silicon substrate 224 enables a heat spreader 234 to be directly attached to the top of the silicon substrate 224, and to be referenced laterally by reference features 233 in the lens array 232. By attaching the heat spreader 234 to the top of the silicon substrate 224, heat may be conducted away from active devices, for example, OE arrays 22 and drivers/TIAs 26, and distributed to a top side heat sink/spreader 234.

Figure 13:
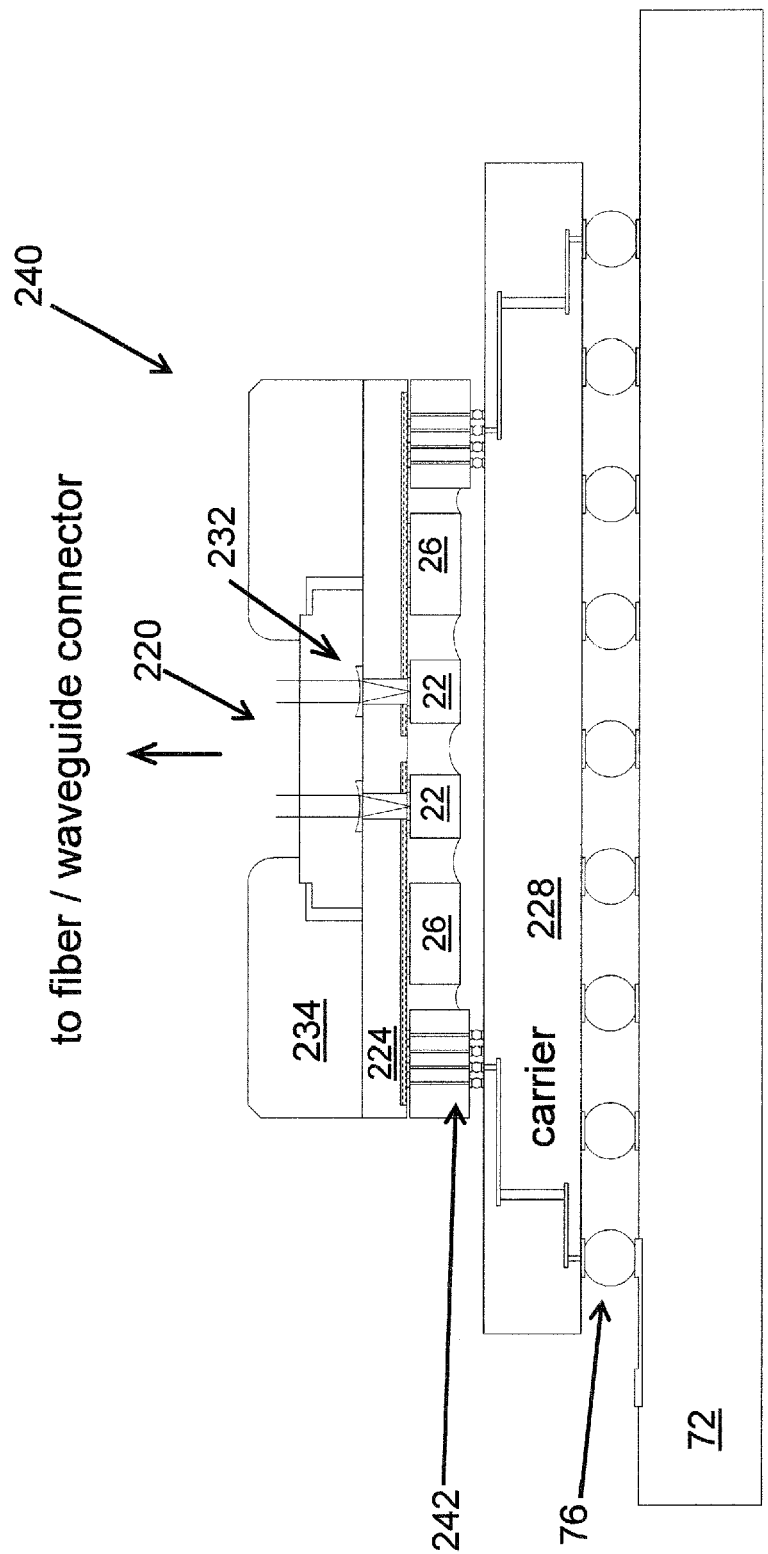
FIG. 13 is a side elevational view of another embodiment of an integrated OE assembly with a silicon spacer frame attached to a carrier substrate.

Referring to FIG. 13, another embodiment of an OE package 240 includes the OE assembly shown in FIG. 12, however, in the OE package 240, a second silicon spacer 242 (or silicon frame) having silicon vias there through is attached to the first silicon substrate 224. In this case a cavity is not required in the organic or ceramic carrier and the OE assembly may be attached to a flat carrier as shown.

Thereby, the OE packages and OE assemblies shown in the embodiments of the invention, integrate the OE transceiver elements in a compact space. Thereby, the present invention provides a system and assembly of integrated packaging, and a method of integrated packaging for reducing the size and lowering the cost of optical transceivers. More specifically, the optoelectronic drivers and receivers are processed and packaged with optical coupling elements, and OE (VCSEL and PD) elements using a wafer scale packaging technology, together with 3D stacking, for integrating the elements in a compact space, resulting in improved density of components and lower cost manufacturing or fabrication.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. An optoelectronic (OE) assembly for a semiconductor or computer chip, comprising:
   a silicon layer with wiring, the silicon layer defining at least one optical via for allowing light to pass therethrough from a light source;

an optical coupling layer bonded to the silicon layer, the optical coupling layer including a plurality of microlenses for focusing and or collimating the light through the optical via;

a plurality of OE elements coupled to the silicon layer and electrically communicating with the wiring, at least one of the OE elements positioned in optical alignment with the optical via for receiving the light, the silicon layer and the wiring being between the OE elements and the optical coupling layer, and the OE elements being in spaced relation with the optical coupling layer having the wiring therebetween;

a carrier for interposing between electrical interconnect elements, the carrier including a recessed portion which houses the OE elements, the carrier being positioned between the wiring of the silicon layer and a circuit board and electrically connecting first interconnect elements connected to the wiring of the silicon layer and second interconnect elements connected to the circuit board; and a heat spreader positioned between a bottom surface of the recessed portion and a bottom surface of the OE elements, the heat spreader being configured to provide thermal conductivity from the OE elements.

2. The assembly of claim 1, wherein the plurality of OE elements are attached beneath the silicon layer and electrically communicating with the wiring, and the OE elements are positioned in optical alignment with the optical via for receiving the light.

3. The assembly of claim 1, further comprising:
VCSELs (vertical cavity surface emitting lasers) and photodiodes as OE elements.

4. The assembly of claim 1, further comprising:
interconnect elements for attaching the assembly to an additional level of packaging.

5. The assembly of claim 4, wherein the interconnect elements include C4s, and compressions bond pads.

6. The assembly of claim 1, wherein at least one of the OE elements is a laser diode driver and transimpedance (LDD/TIA) element, the LDD/TIA element includes circuitry, and the wiring is positioned between the LDD/TIA element and the microlenses for electrically connecting the LDD/TIA element to interconnect elements.

7. The OE assembly of claim 1, further comprising:
at least one semiconductor element attached to a carrier, the carrier electrically connected to the wiring of the silicon layer and a circuit board.

8. The OE assembly of claim 7, wherein the semiconductor element is selected from a group comprising: a processor and an application specific integrated circuit (ASIC) chip.

9. An optoelectronic (OE) package or system for semiconductor fabrication, comprising:
a silicon layer with wiring, the silicon layer defining at least one optical via for allowing light to pass therethrough;
an optical coupling layer bonded to the silicon layer, the optical coupling layer including a plurality of microlenses for focusing and or collimating the light through the optical via;
a plurality of OE elements coupled to the silicon layer and electrically communicating with the wiring, at least one of the OE elements positioned in optical alignment with the optical via for receiving the light;
a carrier for interposing between electrical interconnect elements, the carrier including a recessed portion which houses the OE elements, the carrier positioned between the wiring of the silicon layer and a circuit board and the carrier electrically connecting first interconnect elements connected to the wiring of the silicon layer and second interconnect elements connected to the circuit board, the silicon layer and the wiring being between the OE elements and the optical coupling layer, and the OE elements being in spaced relation with the optical coupling layer having the wiring therebetween; and
a heat spreader positioned between a bottom surface of the recessed portion and a bottom surface of the OE elements, the heat spreader being configured to provide thermal conductivity from the OE elements.

10. The assembly of claim 9, wherein at least one of the OE elements is a laser diode driver and transimpedance (LDD/TIA) element, the LDD/TIA element includes circuitry, and the wiring is positioned between the LDD/TIA element and the microlenses for electrically connecting the LDD/TIA element to interconnect elements.

11. The assembly of claim 9, wherein the carrier includes a recessed portion for housing the OE elements.

12. A method for assembling or packaging a semiconductor or chip, comprising:
fabricating a silicon layer with wiring, the silicon layer defining at least one optical via for allowing light to pass therethrough;
bonding an optical coupling layer to the silicon layer, the optical coupling layer including a plurality of microlenses for focusing and or collimating the light through the optical via;
coupling a plurality of OE elements to the silicon layer and the OE elements electrically communicating with the wiring;
positioning at least one of the OE elements in optical alignment with the optical via for receiving the light;
interposing a carrier between electrical interconnect elements, and positioning the carrier between the wiring of the silicon layer and a circuit board and electrically connecting first interconnect elements to the wiring of the silicon layer and second interconnect elements to the circuit board;
housing the OE elements in a recessed portion of the carrier;
positioning the silicon layer and the wiring between the OE elements and the optical coupling layer and positioning the OE elements in spaced relation with the optical coupling layer having the wiring therebetween; and
positioning a heat spreader between a bottom surface of the recessed portion and a bottom surface of the OE elements, the heat spreader being configured to provide thermal conductivity from the OE elements.

\* \* \* \* \*